United States Patent
He et al.

(10) Patent No.: US 9,136,354 B2
(45) Date of Patent: Sep. 15, 2015

(54) METHODS FOR MANUFACTURING PASSIVATION LAYER AND THIN FILM TRANSISTOR ARRAY SUBSTRATE

(75) Inventors: Chengming He, Shenzhen (CN); Fengju Liu, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 821 days.

(21) Appl. No.: 13/219,942

(22) Filed: Aug. 29, 2011

(65) Prior Publication Data

US 2012/0129303 A1  May 24, 2012

(30) Foreign Application Priority Data

Nov. 23, 2010  (CN) .......................... 2010 1 0557575

(51) Int. Cl.
  *H01L 21/00*  (2006.01)
  *H01L 21/322*  (2006.01)
  *H01L 29/66*  (2006.01)
  *H01L 27/12*  (2006.01)

(52) U.S. Cl.
  CPC ....... *H01L 29/66765* (2013.01); *H01L 27/1259* (2013.01)

(58) Field of Classification Search
  None
  See application file for complete search history.

(56) References Cited

U.S. PATENT DOCUMENTS

| 4,705,760 | A | | 11/1987 | Kaganowicz et al. |
|---|---|---|---|---|
| 5,545,289 | A | * | 8/1996 | Chen et al. ................. 438/694 |
| 6,355,576 | B1 | * | 3/2002 | Haley et al. ................. 438/745 |
| 2004/0198046 | A1 | * | 10/2004 | Yu-Chou et al. ............ 438/689 |
| 2009/0000640 | A1 | * | 1/2009 | Aoki et al. .................... 134/1.3 |
| 2009/0200553 | A1 | | 8/2009 | Yang et al. |
| 2009/0256158 | A1 | * | 10/2009 | Xue .............................. 257/72 |

FOREIGN PATENT DOCUMENTS

| CN | 101465296 A | 6/2009 |
|---|---|---|
| CN | 101681932 A | 3/2010 |
| JP | 2000-188288 A | 7/2000 |
| JP | 2008188032 A * | 8/2008 |

* cited by examiner

*Primary Examiner* — Calvin Choi
(74) *Attorney, Agent, or Firm* — JMB Davis Ben-David (57) ABSTRACT

The present invention provides methods for manufacturing a passivation layer and a thin film transistor (TFT) array substrate. The method for manufacturing the passivation layer comprises the following steps: placing a substrate in a vacuum process chamber; providing an ammonia gas and a nitrogen gas into the vacuum process chamber; forming plasma and evaporating water vapor; and forming the passivation layer on the substrate. The method for manufacturing the passivation layer can be applicable to the method for manufacturing the TFT array substrate. The present invention can enhance the quality of the passivation layer.

9 Claims, 6 Drawing Sheets

METHODS FOR MANUFACTURING PASSIVATION LAYER AND THIN FILM TRANSISTOR ARRAY SUBSTRATE

FIELD OF THE INVENTION

The present invention relates to a field of a liquid crystal display technology, and more particularly to methods for manufacturing a passivation layer and a thin film transistor (TFT) array substrate.

BACKGROUND OF THE INVENTION

Liquid crystal displays (LCDs) have been widely applied in electrical products. Currently, most of LCDs are backlight type LCDs which comprise a liquid crystal panel and a backlight module. In general, the LCD panel may include a color filter (CF) substrate and a TFT array substrate. The CF substrate includes a plurality of color filters and a common electrode. The TFT array substrate includes a plurality of parallel scanning lines, a plurality of parallel data lines, a plurality of TFTs and a plurality of pixel electrodes. The scanning lines are respectively vertical to the data lines. Each adjacent two of the scanning lines and each adjacent two of the data lines intersect to define a pixel area.

In a process for fabricating the TFT array substrate, a passivation layer is necessary to be formed on the TFTs. Currently, the passivation layer is deposited by a plasma enhanced chemical vapor deposition (PECVD) method. At this time, the TFT array substrate is transported into a vacuum process chamber of a PECVD apparatus for depositing the passivation layer.

However, when a vacuum-pumping is implemented in the vacuum process chamber of the PECVD apparatus, the pressure therein drops off rapidly, and thus the temperature therein drops off correspondingly, and water-vapor is susceptible to condensed on TFT array substrate. Therefore, after forming the passivation layer, the water-vapor or water drop is susceptible to be kept between the passivation layer and the substrate, resulting in the deterioration of the performance of the TFTs.

As a result, it is necessary to provide methods for manufacturing a passivation layer and a TFT array substrate to solve the problems existing in the conventional technologies, as described above.

SUMMARY OF THE INVENTION

A primary object of the present invention is to provide a method for manufacturing a passivation layer, and the method comprises the following steps: placing a substrate in a vacuum process chamber; providing an ammonia gas and a nitrogen gas into the vacuum process chamber; applying a voltage between two electrodes disposed in the vacuum process chamber to form plasma and evaporate water vapor; and forming the passivation layer on the substrate.

Another object of the present invention is to provide a method for manufacturing a thin film transistor array substrate, and the method comprises the following steps: forming a plurality of gate electrodes on a transparent substrate; forming a plurality of source electrodes and a plurality of drain electrodes on the gate electrodes, wherein a plurality of channels are formed between the source electrodes and the drain electrodes; placing the transparent substrate in a vacuum process chamber; providing an ammonia gas and a nitrogen gas into the vacuum process chamber; applying a voltage between two electrodes disposed in the vacuum process chamber to form plasma and evaporate water vapor; forming a passivation layer on the channels, the source electrodes and the drain electrodes; and forming a pixel electrode layer on the passivation layer, wherein the pixel electrode layer is electrically connected to the drain electrodes.

A further object of the present invention is to provide a method for manufacturing a thin film transistor array substrate, and the method comprises the following steps: forming a plurality of gate electrodes on a transparent substrate; forming a plurality of source electrodes and a plurality of drain electrodes on the gate electrodes, wherein a plurality of channels are formed between the source electrodes and the drain electrodes; placing the transparent substrate in a vacuum process chamber; providing an ammonia gas and a nitrogen gas into the vacuum process chamber; applying a voltage between two electrodes disposed in the vacuum process chamber to form plasma and evaporate water vapor, wherein hydrogen ions dissociated from the ammonia gas is utilized to occupy dangling-bonds in amorphous-silicon of the channels; forming a passivation layer on the channels, the source electrodes and the drain electrodes; and forming a pixel electrode layer on the passivation layer, wherein the pixel electrode layer is electrically connected to the drain electrodes.

In one embodiment of the present invention, before providing the ammonia gas and the nitrogen gas, the substrate is heated.

In one embodiment of the present invention, the applied voltage is a radio frequency signal.

In one embodiment of the present invention, before providing the ammonia gas and the nitrogen gas, a hydrogen gas is provided into the vacuum process chamber, and a voltage is applied between the electrodes to form plasma.

In one embodiment of the present invention, when forming the passivation layer on the substrate, a reaction gas is provided into the vacuum process chamber, and a voltage is applied between the electrodes to form plasma.

In one embodiment of the present invention, when providing the ammonia gas and the nitrogen gas, a hydrogen gas is provided into the vacuum process chamber at the same time.

The methods of the present invention for manufacturing the passivation layer and the TFT array substrate can completely eliminate the water vapor on the substrate to enhance the performance of the TFTs and reduce scrap products. Moreover, an ammonia plasma treatment can integrate with or replace a hydrogen plasma treatment, so as to reduce the process time and increase the production capacity.

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

The following embodiments are referring to the accompanying drawings for exemplifying specific implementable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

In the drawings, structure-like elements are labeled with like reference numerals.

Figure 1:
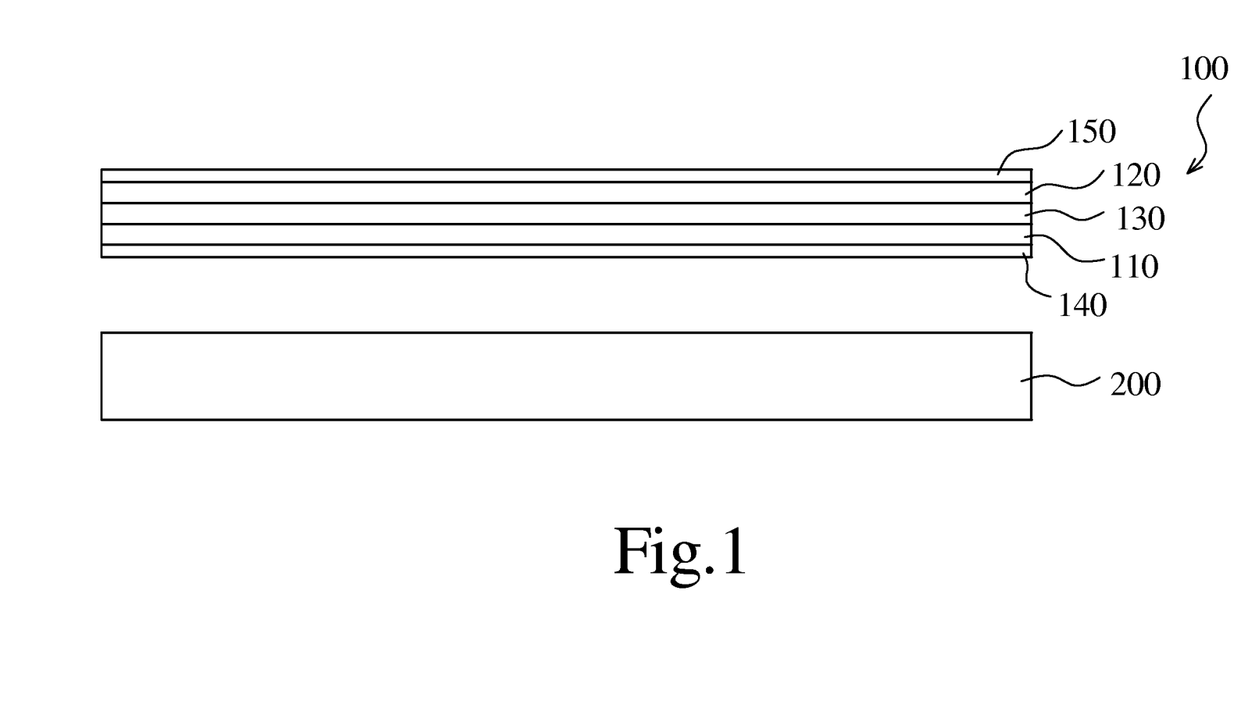
FIG. 1 is a cross-sectional view showing a display panel and a backlight module according to an embodiment of the present invention.
Figure 2:
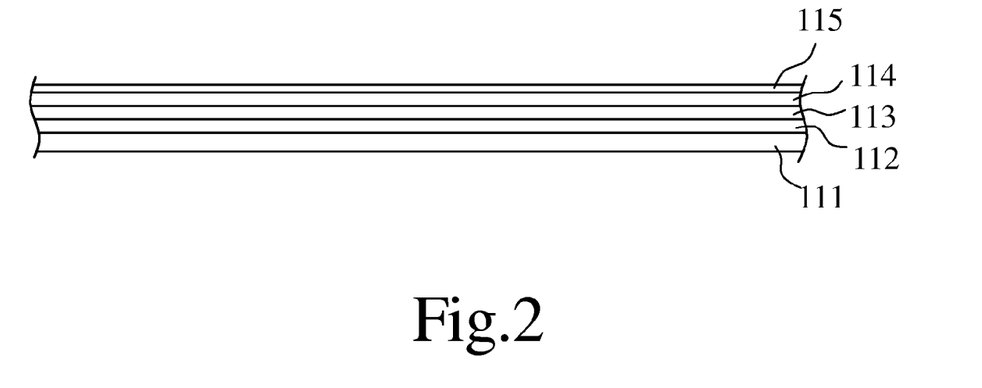
FIG. 2 through FIG. 7 are schematic flow diagrams showing a process for manufacturing a TFT array substrate according to an embodiment of the present invention.
Figure 3:
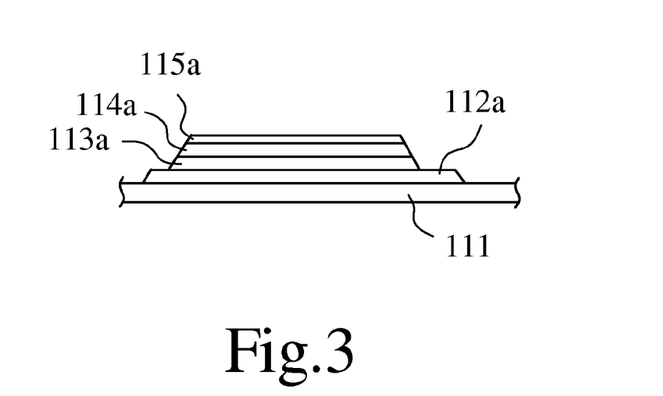
Figure 4:
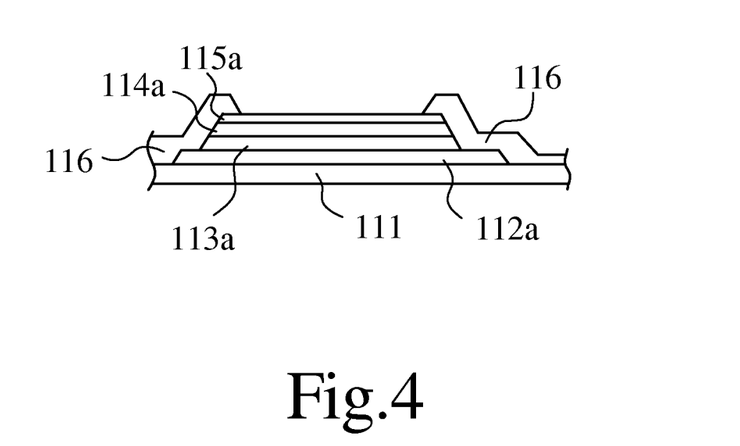
Figure 5:
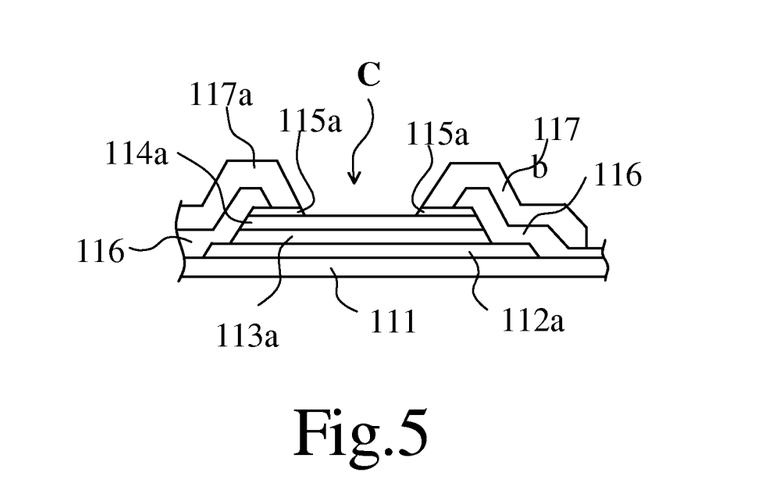
Figure 6:
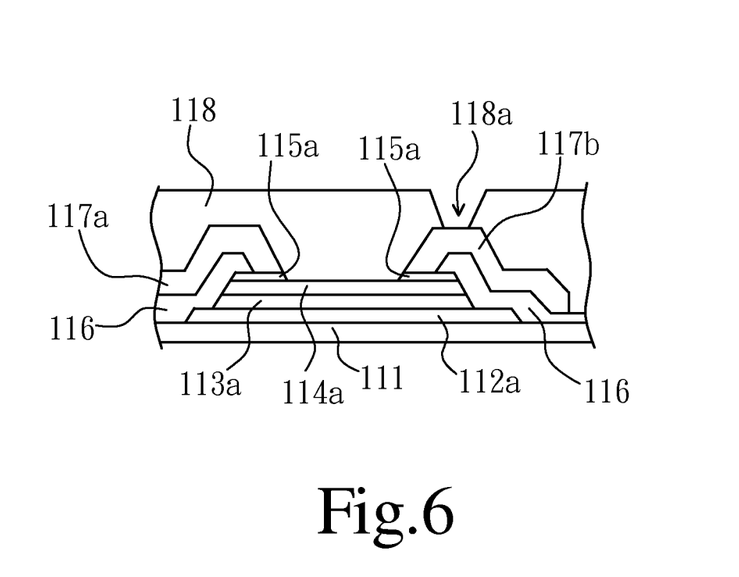

Referring to FIG. 1, a cross-sectional view showing a display panel and a backlight module according to an embodiment of the present invention is illustrated. The method of the present embodiment for manufacturing the passivation layer can be applicable to the fabrication of the display panel 100, so as to form the passivation layer of transistors. When utilizing the display panel 100 of the present embodiment to fabricate a display apparatus, the display panel 100 may be disposed on the backlight module 200, thereby forming a liquid crystal display apparatus. The display panel 100 may comprise a first substrate 110, a second substrate 120, a liquid crystal layer 130, a first polarizer 140 and a second polarizer 150. The first substrate 110 and the second substrate 120 may be realized as glass substrates or flexible plastic substrates. In this embodiment, the first substrate 110 may be, for example, a TFT array substrate, and the second substrate 120 may be, for example, a color filter (CF) substrate. It notes that the CF and the TFT array may also be disposed on the same substrate in other embodiments.

Referring to FIG. 1 again, the liquid crystal layer 130 is formed between the first substrate 110 and the second substrate 120. The first polarizer 140 is disposed on one side of the first substrate 110 and opposite to the liquid crystal layer 130 (as a light-incident side). The second polarizer 150 is disposed on one side of the second substrate 120 and opposite to the liquid crystal layer 130 (as a light-emitting side).

Referring to FIG. 2 through FIG. 7, schematic flow diagrams showing a process for manufacturing a TFT array substrate according to an embodiment of the present invention are illustrated. When manufacturing the TFT array substrate (such as the first substrate 110) of the present embodiment, referring to FIG. 2, firstly, a transparent substrate 111 is provided, and the transparent substrate 111 may be a quartz or glass substrate. Next, an electrode layer 112, a gate insulating layer 113, a semiconductor layer 114 and an ohmic contact layer 115 are formed on the transparent substrate 111 in sequence. The material of the electrode layer 112 may be Al, Ag, Cu, Mo, Or, W, Ta, Ti, metal nitride or any alloys thereof. Furthermore, the metallic layer may be a multi-layer structure with heat-resistant film and lower resistance film, such as dual-layer structure with molybdenum nitride film and Al film. The material of the gate insulating layer 113 may be silicon nitride ($SiN_x$) or silicon oxide ($SiO_x$) which may be formed with a PECVD method. The semiconductor layer 114 is preferably made of amorphous silicon (a-Si) or polycrystalline silicon. In this embodiment, for forming the semiconductor layer 114, an a-Si layer can be first deposited, and then a rapid thermal annealing step is performed to the a-Si layer, thereby allowing the a-Si layer to recrystallize into a polycrystalline silicon layer. The material of the ohmic contact layer 115 are preferably made of N+a-Si (or silicide) heavily doped with N dopant (such as phosphorous) using such as ion implantation or chemical vapor deposition method.

Referring to FIG. 3 again, the electrode layer 112, the gate insulating layer 113, the semiconductor layer 114 and the ohmic contact layer 115 are patterned, thereby forming a patterned electrode layer 112a, a patterned gate insulating layer 113a, a patterned semiconductor layer 114a and a patterned ohmic contact layer 115a, and exposing a portion of the patterned electrode layer 112a to form gate electrodes of the TFTs on the transparent substrate 111, wherein the patterned semiconductor layer 114a can be semiconductor islands of the TFTs.

Subsequently, referring to FIG. 4 again, insulating layers 116 are formed on the gate (patterned electrode layer 112a) and a portion of the patterned ohmic contact layer 115a, respectively, wherein the insulating layers 116 are formed on two opposite sides of the patterned ohmic contact layer 115a, and another portion of the patterned ohmic contact layer 115a is exposed. Next, referring to FIG. 5 again, source electrodes 117a and drain electrodes 117b are formed on the gates using photolithography, and portions of the patterned semiconductor layers 114a are exposed to form channels C, wherein the channels C are formed between the source electrodes 117a and the drain electrodes 117b.

Subsequently, referring to FIG. 6 again, the passivation layer 118 is formed on the channels C, the source electrodes 117a and the drain electrodes 117b, wherein the passivation layer 118 includes at least one contact hole 118a to expose a portion of the drain electrodes 117b.

Figure 8:
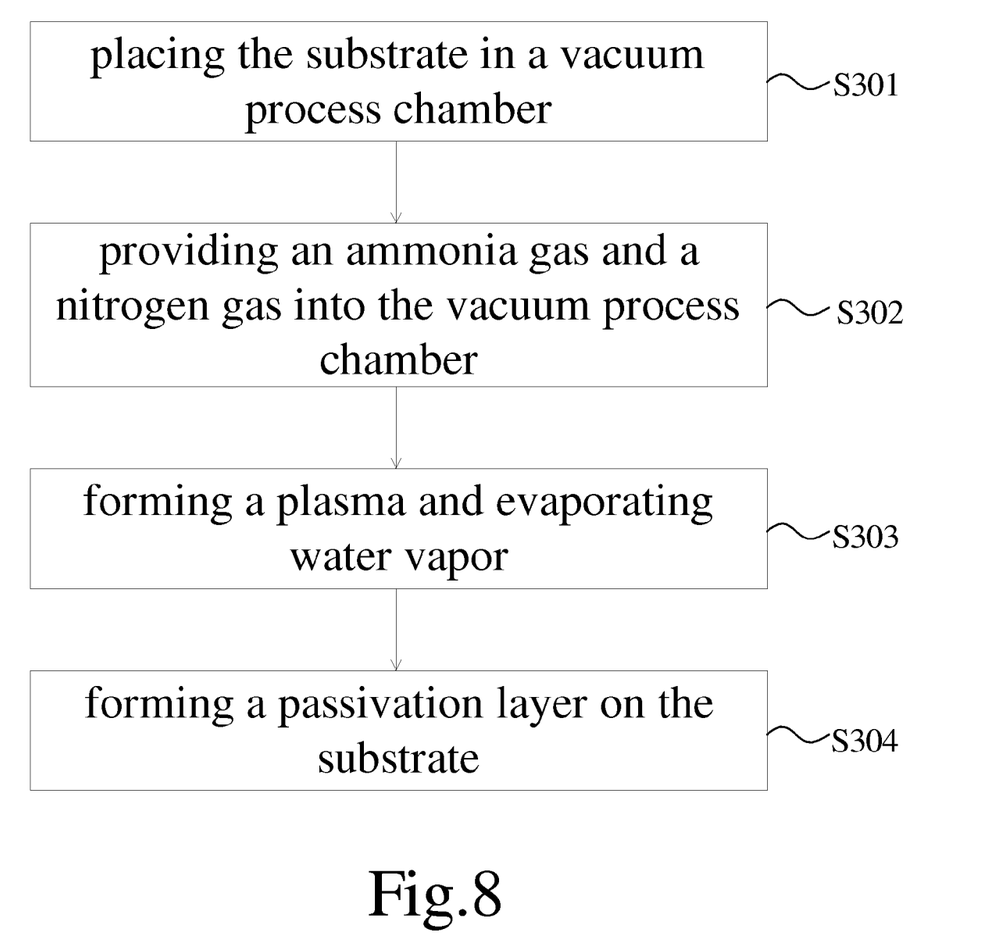
FIG. 8 is a flow diagram showing a method for manufacturing the passivation layer according to an embodiment of the present invention.
Figure 9:
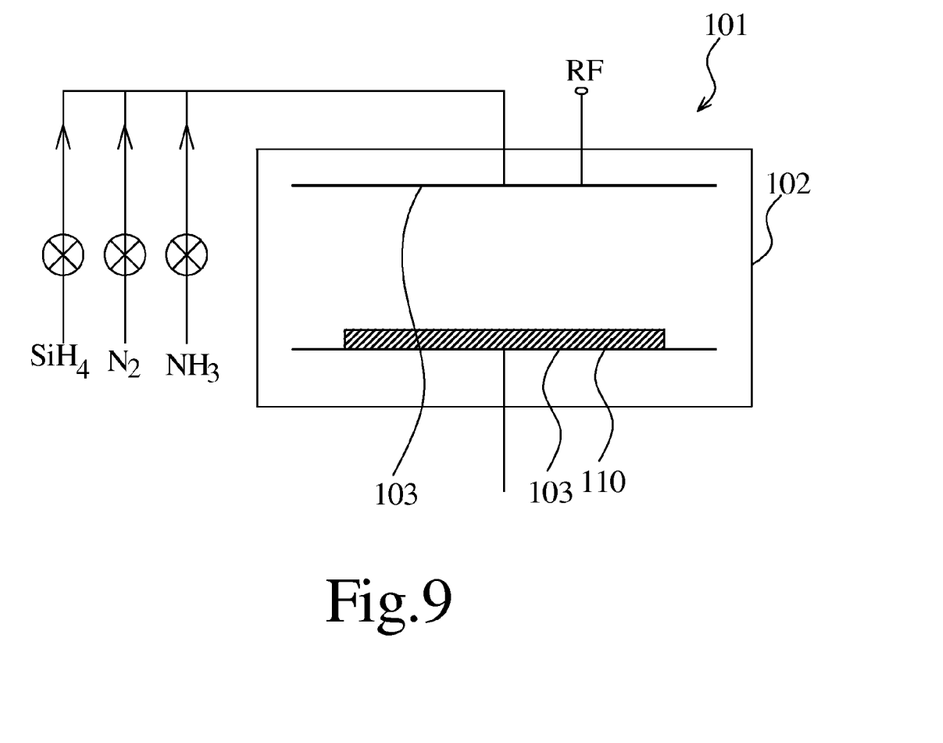
FIG. 9 is a schematic diagram showing a PECVD apparatus according to an embodiment of the present invention.

Referring to FIG. 8 and FIG. 9, FIG. 8 is a flow diagram showing a method for manufacturing the passivation layer according to an embodiment of the present invention, and FIG. 9 is a schematic diagram showing a PECVD apparatus according to an embodiment of the present invention. When forming the passivation layer 118, for example, the passivation layer 118 is formed using the PECVD apparatus 101. After forming the source electrodes 117a and the drain electrodes 117b, the substrate 110 (i.e. the transparent substrate 111), where the passivation layer 118 is needed to be formed, is placed in the vacuum process chamber 102 of the PECVD apparatus 101 (step 301), wherein the substrate 110 is positioned between two electrodes 103 disposed therein. Next, the vacuum-pumping is performed in the vacuum process chamber 102 to create a vacuum environment therein. Furthermore, the substrate 110 in the vacuum process chamber 102 can be heated to eliminate the water vapor on the surface of the substrate 110.

Subsequently, referring to FIG. 8 and FIG. 9 again, an ammonia gas ($NH_3$) and a nitrogen gas ($N_2$) are provided into the vacuum process chamber 102 (step 302), a voltage is applied between the two electrodes 103 therein to form a plasma and utilize the high temperature produced in this reaction to evaporate the water vapor on the substrate 110 (step 303). The applied voltage is, for example, a radio frequency (RF) signal. At this time, the ammonia gas and the nitrogen gas can be introduced into the vacuum process chamber 102 to form the plasma and the high temperature, thereby evaporating the water vapor on the substrate 110. Furthermore, at this time, the water vapor on the substrate 110 can be completely removed before forming solid materials thereon, thereby preventing the water vapor from being covered by thin films. The evaporated water vapor ($H_2O$) can react with the ammonia gas ($NH_3$) to form $NH_3.H_2O$, and a portion thereof dissociate into $NH_{4+}$. The $NH_3.H_2O$ and $NH_{4+}$ can be pumped out the vacuum process chamber 102.

Referring to FIG. 8 and FIG. 9 again, before introducing the ammonia gas and the nitrogen gas to form the plasma, a hydrogen ($H_2$) gas can be provided into the vacuum process chamber 102, and a voltage is applied between the two electrodes 103 therein to form plasma. At this time, hydrogen ions (H+) can be formed with the plasma, and the hydrogen ions can be utilized to occupy dangling-bonds in amorphous-silicon (a-Si) of the channels C for improving defects of the channels C and reducing the leakage current.

Subsequently, referring to FIG. 8 and FIG. 9 again, after introducing the ammonia gas and the nitrogen gas to form the plasma, a reaction gas (such as $SiH_4$) is provided into the vacuum process chamber 102, and a voltage is applied between the two electrodes 103 therein to form plasma, and thus a chemical process is formed therein for depositing and forming the passivation layer 118 on the substrate 110 (step 304).

Therefore, before depositing the passivation layer 118 on the substrate 110, the water vapor on the substrate 110 can be completely evaporated and eliminated to prevent the water vapor from being covered by the passivation layer 118. Accordingly, the performance of the TFT elements of the substrate 110 can be enhanced to reduce scrap products.

Figure 7:
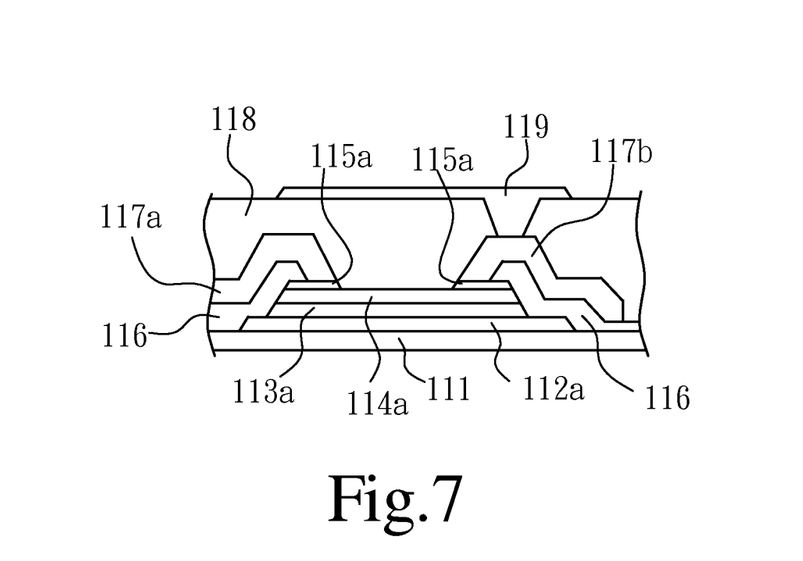

Subsequently, referring to FIG. 7, a transparent and electrically conductive layer (such as ITO, IZO, AZO, GZO, TCO or ZnO) is first formed on the passivation layer 118, and then the transparent and electrically conductive layer is patterned to form an electrode layer 119 with using photolithography. The electrode layer 119 covers the contact hole 118a of the passivation layer 118, and thus the electrode layer 119 can be electrically connected to the drain electrodes 117b through the contact hole 118a, thereby forming the TFT array substrate 110 of the present embodiment.

Referring to FIG. 9 again, in one embodiment, when providing the ammonia gas and the nitrogen gas into the vacuum process chamber 102, the hydrogen ($H_2$) can also be provided therein at the same time, and the voltage can be applied between the two electrodes 103 therein to form plasma. At this time, the plasma formed by the $NH_3$ and $H_2$ can completely eliminate the water vapor on the substrate 110, and the hydrogen ions (H+) dissociated from the $NH_3$ and $H_2$ can be utilized to occupy dangling-bonds in a-Si of the channels for reducing the leakage current. Therefore, a $NH_3$ plasma treatment and a $H_2$ plasma treatment can be implemented simultaneously to reduce the process time of the passivation layer 118 and increase the production capacity.

Referring to FIG. 7 again, in another embodiment, the hydrogen may be not necessary to be provided into the vacuum process chamber 102. At this time, the hydrogen ions (H+) dissociated from the $NH_3$ can be utilized to occupy dangling-bonds in a-Si of the channels for reducing the leakage current. Therefore, in this embodiment, the $NH_3$ plasma treatment can simultaneously eliminate the water vapor on the substrate 110 and fill the dangling-bonds for reducing the leakage current.

As described above, the methods of the present invention for manufacturing the passivation layer and the TFT array substrate can completely eliminate the water vapor on the substrate to enhance the performance of the TFTs and reduce scrap products. Moreover, the $NH_3$ plasma treatment can integrate with or replace the $H_2$ plasma treatment, so as to reduce the process time and increase the production capacity.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A method for manufacturing a thin film transistor array substrate, characterized in that: the method comprises the following steps:
    forming a plurality of gate electrodes on a transparent substrate;
    forming a plurality of source electrodes and a plurality of drain electrodes on the gate electrodes, wherein a plurality of channels are formed between the source electrodes and the drain electrodes;
    placing the transparent substrate in a vacuum process chamber;
    providing an ammonia gas and a nitrogen gas into the vacuum process chamber;
    applying a voltage between two electrodes disposed in the vacuum process chamber to form plasma and evaporate water vapor, wherein hydrogen ions dissociated from the ammonia gas is utilized to occupy dangling-bonds in amorphous-silicon of the channels;
    forming a passivation layer on the channels, the source electrodes and the drain electrodes; and
    forming a pixel electrode layer on the passivation layer, wherein the pixel electrode layer is electrically connected to the drain electrodes.
    wherein evaporated water vapor reacts with the ammonia gas to form $NH_3.H_2O$, and a portion thereof dissociates into $NH_4+$, and the $NH_3.H_2O$ and $NH_4+$ are pumped out the vacuum process chamber; and
    before providing the ammonia gas and the nitrogen gas or when providing the ammonia gas and the nitrogen gas, a hydrogen gas is provided into the vacuum process chamber, and a voltage is applied between the electrodes to form plasma.

2. A method for manufacturing a passivation layer, wherein the method comprises the following steps:
    placing a substrate in a vacuum process chamber;
    providing an ammonia gas and a nitrogen gas into the vacuum process chamber;
    applying a voltage between two electrodes disposed in the vacuum process chamber to form plasma and a high temperature, thereby evaporating the water vapor on the substrate; and
    forming the passivation layer on the substrate;
    wherein the evaporated water vapor reacts with the ammonia gas to form $NH_3.H_2O$, and a portion thereof dissociates into $NH_4+$, and the $NH_3.H_2O$, and $NH_4+$ are pumped out the vacuum process chamber;
    wherein before providing the ammonia gas and the nitrogen gas or when providing the ammonia gas and the nitrogen gas, a hydrogen gas is provided into the vacuum process chamber, and a voltage is applied between the electrodes to form plasma.

3. The method according to claim 2, wherein before providing the ammonia gas and the nitrogen gas, the substrate is heated.

4. The method according to claim 2, wherein the applied voltage is a radio frequency signal.

5. The method according to claim 2, wherein when forming the passivation layer on the substrate, a reaction gas is provided into the vacuum process chamber, and a voltage is applied between the electrodes to form plasma.

6. A method for manufacturing a thin film transistor array substrate, wherein the method comprises the following steps:
    forming a plurality of gate electrodes on a transparent substrate;
    forming a plurality of source electrodes and a plurality of drain electrodes on the gate electrodes, wherein a plurality of channels are formed between the source electrodes and the drain electrodes;

placing the transparent substrate in a vacuum process chamber;

providing an ammonia gas and a nitrogen gas into the vacuum process chamber;

applying a voltage between two electrodes disposed in the vacuum process chamber to form plasma and a high temperature, thereby evaporating the water vapor on the transparent substrate;

forming a passivation layer on the channels, the source electrodes and the drain electrodes; and forming a pixel electrode layer on the passivation layer, wherein the pixel electrode layer is electrically connected to the drain electrodes;

wherein the evaporated water vapor reacts with the ammonia gas to form $NH_3 \cdot H_2O$, and a portion thereof dissociates into $NH_4+$, and the $NH_3 \cdot H_2O$ and $NH_4+$ are pumped out the vacuum process chamber;

wherein before providing the ammonia gas and the nitrogen gas or when providing the ammonia gas and the nitrogen gas, a hydrogen gas is provided into the vacuum process chamber, and a voltage is applied between the electrodes to form plasma.

7. The method according to claim 6, wherein before providing the ammonia gas and the nitrogen gas, the substrate is heated.

8. The method according to claim 6, wherein the applied voltage is a radio frequency signal.

9. The method according to claim 6, wherein when forming the passivation layer on the substrate, a reaction gas is provided into the vacuum process chamber, and a voltage is applied between the electrodes to form plasma.

* * * * *